(12) United States Patent
Cortez (10) Patent No.: US 9,335,343 B1
(45) Date of Patent: May 10, 2016

(54) CONTACTOR FOR REDUCING ESD IN INTEGRATED CIRCUIT TESTING

(75) Inventor: Adrian Cortez, Redwood City, CA (US)

(73) Assignee: Altera Corporation, San Jose, CA (US)

( * ) Notice: Subject to any disclaimer, the term of this patent is extended or adjusted under 35 U.S.C. 154(b) by 421 days.

(21) Appl. No.: 13/436,285

(22) Filed: Mar. 30, 2012

(51) Int. Cl.
*G01R 31/00* (2006.01)
*G01R 1/067* (2006.01)

(52) U.S. Cl.
CPC ............. *G01R 1/067* (2013.01); *G01R 31/00* (2013.01)

(58) Field of Classification Search
CPC ............. G01R 1/0416; G01R 1/07307; G01R 31/025; G01R 31/2853; G01R 31/2884; G01R 1/07342; G01R 1/06772; G01R 1/06727; G01R 1/06788; G01R 1/07357; G01R 31/2886; G01R 1/06744; G01R 1/0466; G01R 1/06716; G01R 1/06738; G01R 1/06755; G01R 1/06711; G01R 31/2891; G01R 3/00; G01R 31/2889; G01R 35/00; G01R 1/07378; G01R 31/2887; H01R 13/6485; H01R 13/6594; H01R 27/00; H01R 13/6658; H01R 13/665802; H01R 13/6666; H01R 24/66; H01R 12/714; H01R 13/2471; H01R 2201/20; H01R 24/50; H01R 13/2442; H01R 13/24; H01R 12/7064; H01R 12/7082; H01R 12/737; H01R 13/62; H01R 13/65802; H01R 43/26; H01R 12/718; H01R 12/721; H01R 12/716; H01R 12/724; H01R 13/2421; H01R 13/2435; H01R 13/6272; H01L 24/49; H01L 24/85; H01L 24/97
See application file for complete search history.

(56) References Cited

U.S. PATENT DOCUMENTS

| | | | | |
|---|---|---|---|---|
| 4,740,746 A * | 4/1988 | Pollock | ............... | G01R 1/06722 324/72.5 |
| 6,844,748 B2 * | 1/2005 | Sato et al. | ................ | 324/756.01 |
| 7,764,072 B2 * | 7/2010 | Strid | ................... | G01R 1/06772 324/149 |
| 7,888,956 B2 * | 2/2011 | Lee et al. | .................. | 324/754.07 |
| 8,026,736 B2 * | 9/2011 | Maloney et al. | ......... | 324/762.01 |
| 8,033,838 B2 * | 10/2011 | Eldridge et al. | ................ | 439/81 |
| 2006/0158206 A1 * | 7/2006 | Boll et al. | ...................... | 324/754 |
| 2008/0007278 A1 * | 1/2008 | Ku et al. | ....................... | 324/754 |
| 2008/0054918 A1 * | 3/2008 | Lin et al. | ...................... | 324/754 |
| 2010/0322024 A1 * | 12/2010 | Yagishita | ...................... | 365/200 |
| 2013/0329353 A1 * | 12/2013 | Savory et al. | ............ | 361/679.33 |

\* cited by examiner

*Primary Examiner* — Vinh Nguyen
(74) *Attorney, Agent, or Firm* — Womble Carlyle Sandridge & Rice LLP (57) ABSTRACT

A test contactor is provided. The test socket includes a printed circuit board (PCB) that transfers electrical signals through a plurality of PCB traces. The plurality of PCB traces couples a signal source to a signal destination. The test contactor also has a first test contact that couples to a first signal pathway from the plurality of PCB traces, whereby the first test contact may be utilized for transferring the electrical signals. The test contactor also has a second test contact that is coupled to a second signal pathway from the plurality of PCB traces, whereby the second test contact may be utilized to provide a ground voltage. The first test contact and the second test contact are of different lengths. A method of testing an integrated circuit is also provided.

21 Claims, 6 Drawing Sheets

CONTACTOR FOR REDUCING ESD IN INTEGRATED CIRCUIT TESTING

BACKGROUND

An integrated circuit (IC) undergoes a testing process as one of the final steps in the IC manufacturing process. The testing process may isolate functional and physical defects that may arise during the manufacturing process.

A common problem that arises during the testing process is an electrostatic discharge (ESD) event. ESD may occur when there is a potential difference between two objects. The potential difference may cause current to flow from an object having a higher voltage potential to an object having a lower voltage potential.

During testing, an ESD event may occur when the IC comes into contact with a test contactor. One of the reasons that the ESD event occurs during testing is due to electron build up (e.g., due to friction between air molecules and the test contactor when the test contactor is exposed to air for a relatively long period of time) on the test contactor. The built-up charges may discharge when the contactor comes into contact with the IC. Input-output (I/O) circuits, which are unable to handle the high ESD voltage or current surges, may be damaged. Therefore, the IC may fail functionally.

It is within this context that the embodiments described herein arise.

SUMMARY

Embodiments described herein provide test contactors and methods for testing integrated circuits (ICs). It should be appreciated that the embodiments can be implemented in numerous ways, such as a process, an apparatus, a system, a device, or a method. Several embodiments are described below.

A test contactor, according to one embodiment of the present invention, is designed to prevent or reduce the chances of Electrostatic Discharge (ESD) event. The test contactor includes a printed circuit board (PCB), a first test contact and a second test contact. The PCB may include a plurality of PCB signal pathways that transfers electrical signals from a signal source to a signal destination. The first test contact, coupled to a first signal pathway of the plurality of PCB signal pathways, may be utilized to transfer electrical signals. The second test contact is coupled to a second signal pathway of the plurality of PCB signal pathways. The second test contact may be grounded. The first test contact and the second contact may have different lengths, e.g., the second test contact may be relatively longer than the first test contact.

In another embodiment, a test apparatus is described. The test apparatus includes a tester and a test contactor. The tester may include an electrical signal source to generate electrical signals and a ground source to provide a ground connection. The test contactor includes a printed circuit board (PCB), a first test contact and a second test contact. The PCB may include a first PCB signal pathway and a second PCB signal pathway, wherein the first PCB signal pathway is coupled to the signal source and the second PCB signal pathway is coupled to the ground source. The first test contact is coupled to the first PCB signal pathway and the second test contact is coupled to the second PCB signal pathway. The first test contact and the second contact may have different lengths, e.g. the second test contact may be longer than the first test contact.

In an alternative embodiment, a method of testing a device-under-test (DUT) is described. The method includes coupling a first test contact having a first length to a first contact pad. The first test contact is compressed by a first predetermined length. A second test contact that has a second length may then be coupled to a second contact pad. The first test contact and the second test contact may then be further compressed by a second predetermined length.

Other aspects of the embodiments will become apparent from the following detailed description, taken in conjunction with the accompanying drawings, illustrated by way of example.

BRIEF DESCRIPTION OF THE DRAWINGS

The embodiments may be understood by reference to the following description taken in conjunction with the accompanying drawings.

DETAILED DESCRIPTION

The following embodiments describe test contactors and methods for testing integrated circuits (ICs). It will be obvious, however, to one skilled in the art, that the present exemplary embodiments may be practiced without some or all of these specific details. In other instances, well-known operations have not been described in detail in order not to unnecessarily obscure the present embodiments.

The embodiments described below illustrate a test contactor. The test contactor, according to one embodiment of the present invention, is designed to prevent or reduce the chance of Electrostatic Discharge (ESD) from occurring. The test contactor includes a plurality of test contacts. The plurality of test contacts may include ground contacts and signal contacts. The test contacts provide connection between the test contactor and a device-under-test (DUT). The test contactor may prevent or reduce the chances of ESD from occurring by equalizing electrostatic charges on the DUT prior to connecting the signal contacts to the DUT. In one embodiment, the ground contacts on the test contactor may be relatively longer than the signal contacts. As such, when the DUT is placed on the test contactor, the ground contacts may be coupled to the DUT first, establishing a ground contact and equalizing electrostatic charges on the DUT, before the signal contacts are coupled to the DUT.

Figure 1:
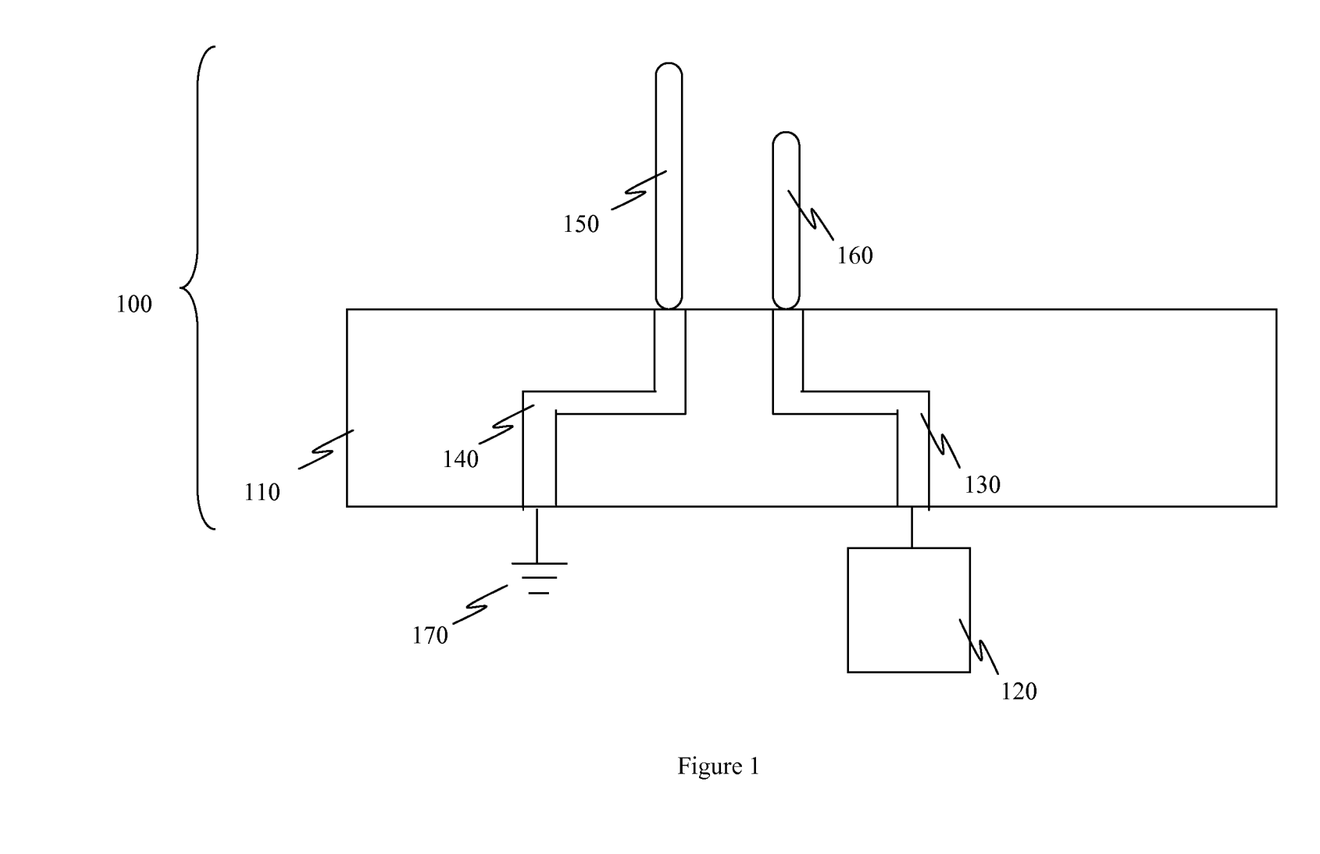
FIG. 1, meant to be illustrative and not limiting, illustrates a test contactor in accordance with one embodiment.

FIG. 1, meant to be illustrative and not limiting, illustrates test contactor 100 in accordance with one embodiment. Test contactor 100 includes Printed Circuit Board (PCB) 110, test contacts 150 and 160, and PCB signal pathways 130 and 140. Test contact 150 may be coupled to ground voltage 170 through PCB signal pathway 140 and test contact 160 may be coupled to signal source 120 through PCB signal pathway 130. It should be appreciated that test contactor 100 may be utilized as an interface between a tester (e.g., tester 310 of FIG. 3) and a DUT (e.g., DUT 230 of FIGS. 2A-2B). Accordingly, test contactor 100 may route signals between the tester and contact pads on the DUT. It should be appreciated that test contactor 100 may include a DUT board, a loadboard, or a probecard, details of which are not shown in order not to unnecessarily obscure the present invention, placed beneath PCB 110.

In an exemplary embodiment, PCB 110 is a substrate board made from a dielectric substance, e.g., epoxy resin. In one embodiment, PCB 110 may be a multilayer substrate and PCB signal pathways 130 and 140 may include PCB traces and via holes connecting the PCB traces on different substrate layers. In an exemplary embodiment, PCB signal pathways 130 and 140 may be composed of copper (Cu). PCB signal pathways 130 and 140 may transfer signals between a tester and a DUT. It should be appreciated that a tester may be an apparatus, e.g., a semiconductor Automated Test Equipment (ATE), that performs a multitude of tests on the DUT, e.g., an IC, to verify the functionality of the DUT. Accordingly, signal source 120 and ground voltage 170 may be provided by a tester. In the embodiment of FIG. 1, PCB signal pathways 130 and 140 receive signals from a bottom surface of PCB 110 (e.g., the surface coupled to signal source 120 and ground voltage 170) and transfer the signals to an upper surface of PCB 110 (e.g. the surface coupled to test contacts 150 and 160).

Signal source 120 may be a signal generator in one embodiment. It should be appreciated that signal source 120 may generate input-output (I/O) signals. In one embodiment, I/O signals from signal source 120 may include high frequency signals, e.g., signals that may have frequencies greater than 500 megahertz (MHz). According to one embodiment, PCB signal pathway 130 transfers signals from signal source 120 to test contact 160 and PCB signal pathway 140 provides ground connection from ground voltage 170 to test contact 150. It should be appreciated that one end of the test contact (e.g., test contact 150 or 160) may be embedded within PCB 110 or may be disposed on a surface of PCB 110.

In one embodiment, test contacts 150 and 160 may have different lengths. For instance, test contact 150 may be relatively longer than test contact 160. In an exemplary embodiment, test contact 150 may be at least 1.3 times longer than test contact 160. The length of test contact 150, according to one embodiment, may need to be substantially longer than test contact 160 in order to prevent the test contacts 150 and 160 from contacting a DUT simultaneously.

In the embodiment of FIG. 1, the relatively longer test contact, test contact 150, is coupled to ground voltage 170 via PCB signal pathway 140. As such, a common ground contact between the DUT and test contactor 100 may be established when test contact 150 is coupled to the DUT. In one embodiment, test contact 150 may be coupled to a ground pad on the DUT and test contact 160 may be coupled to a signal pad on the DUT. The ground pathway, establish when test contact 150 couples with the ground pad, enables discharging of the electrons to ground, equalizing the electrical potential between the DUT and test contactor 100. It should be appreciated that if test contact 160, coupled to signal source 120, makes the contact with the DUT before test contact 150, the built-up electrical charges may discharge to the DUT and may damage sensitive circuitry, e.g., I/O circuitry, within the DUT.

Figure 2A:
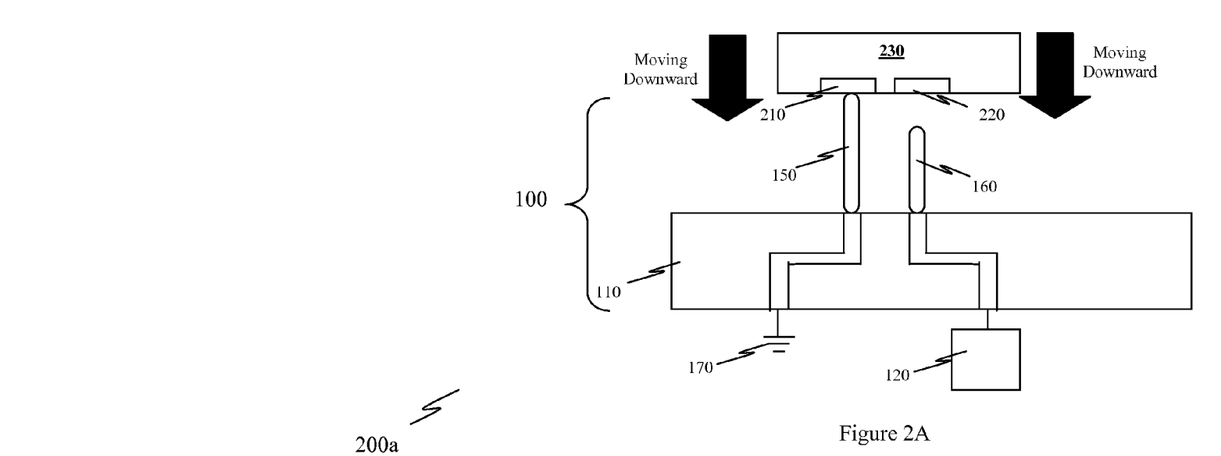
FIGS. 2A-2B, meant to be illustrative and not limiting, illustrate a test contactor contacting a Device-Under-Test (DUT) in accordance with one embodiment.

In one embodiment, test contacts 150 and 160 are pogo pins. It should be appreciated that pogo pins may be constructed with a spring that compresses when force is applied. It is appreciated that test contacts 150 and 160 may have different spring constants. It should be appreciated that according to Hooke's Law a particular spring constant may be related to the amount of distance of which a particular test contact may compress when pressure is applied. As such, if a same pressure is applied to two different test contacts, e.g. test contacts 150 and 160, the test contact with higher spring constant will compress less in comparison to the one with lower spring constant. In the embodiment of FIG. 1, test contact 150 is relatively longer than test contact 160. As such, test contact 150 may include a spring with a lower spring constant compared to the spring constant of the spring within test contact 160. It should be appreciated that even though test contacts 150 and 160 may be pogo pins, other test contacts (e.g., cantilever pins or spring probes) may be used in this context. FIG. 2A, meant to be illustrative and not limiting, illustrates test contactor apparatus 200a with DUT 230 in accordance with one embodiment. System 200a includes test contactor 100 and DUT 230. In one embodiment, test contactor 100 is similar to test contactor 100 of FIG. 1. As such, for the sake of brevity, elements that have been described above will not be described in detail again.

In one exemplary embodiment, DUT 230 may be a programmable logic device (PLD). In another exemplary embodiment, DUT 230 may be an Application Specific Integrated Circuit (ASIC) or an Application Specific Standard Product (ASSP). In the embodiment of FIG. 2A, DUT 230 may include two types of pads, e.g., ground pad 210 and signal pad 220. Ground pad 210 may be coupled to ground voltage 170 through test contact 150 to provide a ground voltage level to DUT 230 and signal pad 220 may be coupled to signal source 120 through test contact 160 to provide signals to DUT 230.

It should be appreciated that there may be different ways to make contact between test contactor 100 and DUT 230 (e.g., test contactor 100 may be moved by the tester to make a contact with DUT 230, test contactor 100 and DUT 230 may be moved simultaneously towards each other, etc). It should be appreciated that DUT 230 may be placed on a test chuck, a loadboard, a DUT board, a test socket, etc.

In the embodiment of FIG. 2A, test contact 150, which is coupled to ground voltage 170, is relatively longer than test contact 160. As such, when DUT 230 is moved towards test contactor 100, test contact 150 may come into contact with ground pad 210 before test contact 160 touches signal pad 220. In one embodiment, the longer test contact (e.g., test contact 150) provides a discharge path for built-up charges in test contactor system 200a. Accordingly, any built-up static charges (either on DUT 230 or test contactor 100) may be discharged to ground 170 via test contact 150 before test contact 160 is coupled to signal pad 220. In one embodiment, providing a discharge path prior to connecting signal pad 220 may prevent or reduce the chances of ESD damaging the DUT 230.

Figure 2B:
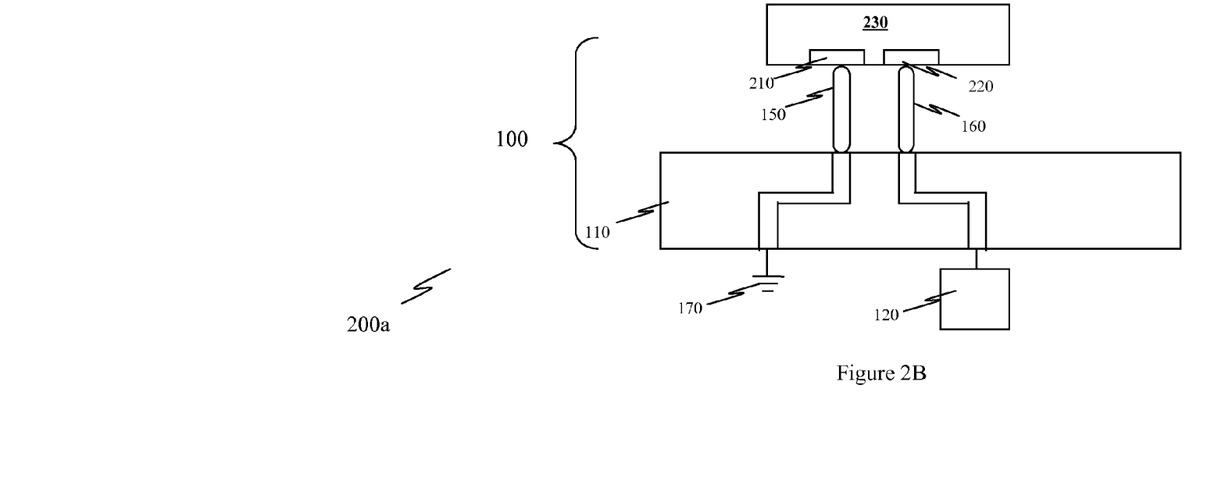

FIG. 2B, meant to be illustrative and not limiting, illustrates test contactor apparatus 200a at a final test position in accordance with one embodiment. At this stage, DUT 230 becomes in contact with test contacts 150 and 160. It should be appreciated that the compression forces at test contacts 150 and 160 may be identical at this stage. In one exemplary embodiment, DUT 230 in apparatus 200a may be pressed against test contacts 150 and 160, compressing the relatively longer test contact (e.g., test contact 150) until the longer test contact becomes substantially the same length as that of the relatively shorter test contact (e.g., test contact 160). Once test contact 150 is coupled to ground pad 210 and test contact 160 is coupled to signal pad 220, different signals may be transmitted from signal source 120 to DUT 230 through test contact 160 to test DUT 230.

Figure 3:
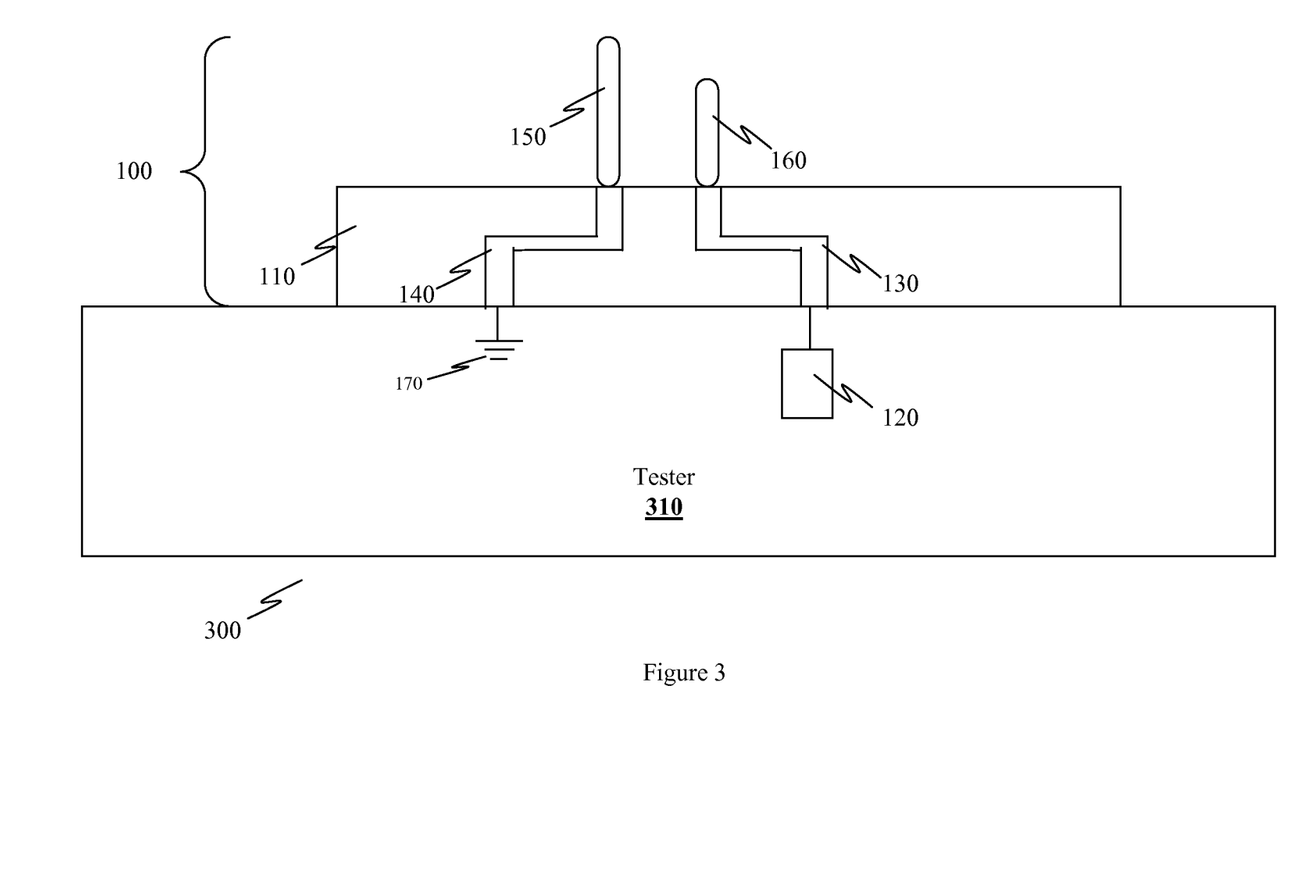
FIG. 3, meant to be illustrative and not limiting, illustrates a test apparatus in accordance with one embodiment.

FIG. 3, meant to be illustrative and not limiting, illustrates test system 300 in accordance with one embodiment. Test system 300 includes tester 310 and test contactor 100. In an exemplary embodiment, test contactor 100 may be similar to test contactor 100 of FIG. 1 and may be coupled to a surface of tester 310. In one embodiment, the surface may include an interface that provides connections between test contacts 150 and 160 on test contactor 100 and signal source that may be generated by tester 310. It should be appreciated that signal source 120 and ground voltage 170 in the embodiments of FIGS. 1, 2A and 2B may reside within the tester 310. Even though only one signal source 120 and one ground voltage 170 are shown, it should be appreciated that tester 310 may provide more than one signal source 120 and ground voltage 170.

Figure 4:
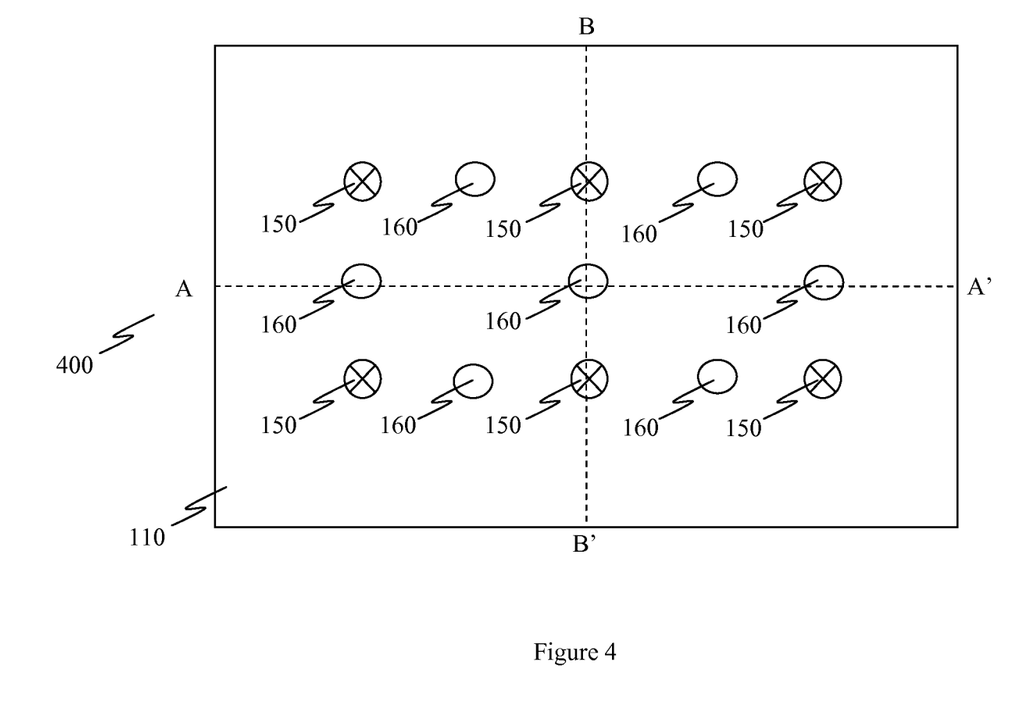
FIG. 4, meant to be illustrative and not limiting, illustrates a distribution of test contacts on a test contactor in accordance with one embodiment.

FIG. 4, meant to be illustrative and not limiting, illustrates a distribution of test contacts on a test contactor in accordance with one embodiment. In one embodiment, test contactor 400 may provide similar functions as test contactor 100 of FIG. 1 and test contacts 150 may be relatively longer than test contacts 160. Even though a specific number of test contacts 150 and 160 are shown in the embodiment of FIG. 4, it should be appreciated that test contactor 400 may include any number of test contacts 150 and 160. In one embodiment, test contacts 150 and 160 may be arranged symmetrically along line A-A' and line B-B'. The symmetrical distribution, according to one embodiment, may prevent test contactor 400 from tilting when test contacts 150 come into contact with the DUT before test contacts 160. However, it should be appreciated that only test contacts 150 may be available in the symmetrical arrangement for preventing test contactor 400 from tilting when test contacts 150 come into contact with the DUT before test contacts 160.

Figure 5:
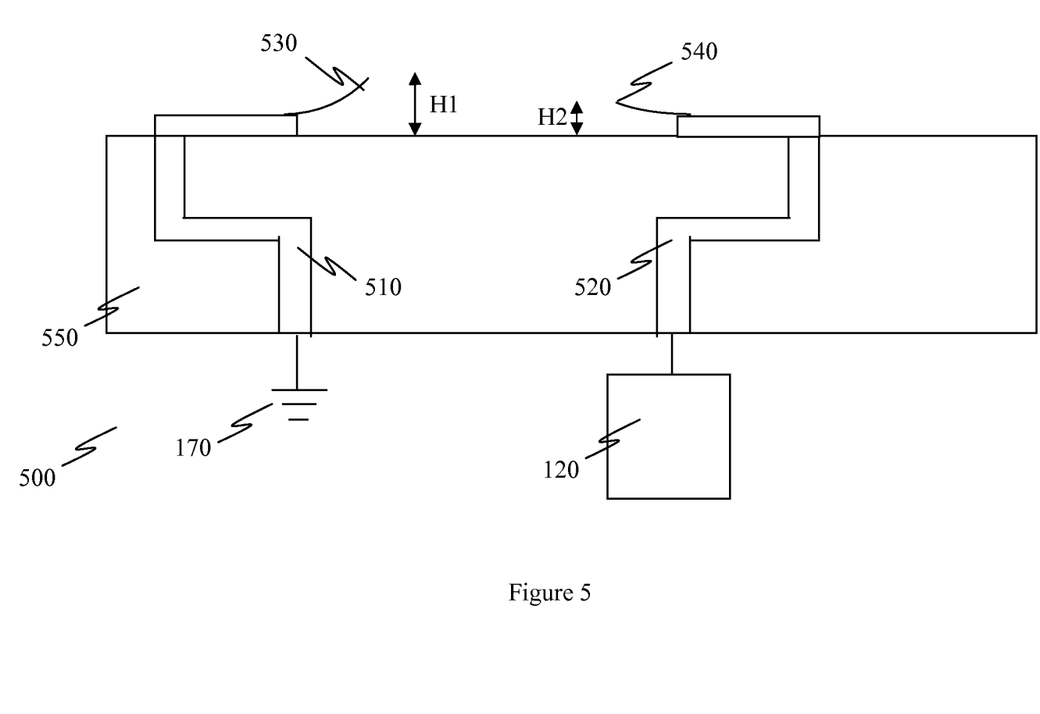
FIG. 5, meant to be illustrative and not limiting, illustrates a test contactor with cantilever pins in accordance with one embodiment.

FIG. 5, meant to be illustrative and not limiting, illustrates a test contactor with cantilever pins in accordance with one embodiment. In one embodiment, test contactor 500 may be functionally similar to test contactor 100 of FIG. 1. As such, for the sake of brevity, elements that have been described above will not be repeated in detail. In the embodiment of FIG. 5, test contacts 530 and 540 are cantilever pins. It should be appreciated that cantilever pins, which may be constructed differently from pogo pins, provide electrical interconnections between test contactor 500 and a DUT that may be coupled to test contactor 500. PCB 550 may include signal pathway 510 and signal pathway 520. In one embodiment, signal pathway 510 is coupled to receive ground voltage 170 and signal pathway 520 is coupled to receive signals from signal source 120. In an exemplary embodiment, cantilever pin 530 may have a vertical height of H1 and cantilever pin 540 may have a vertical height of H2. In one embodiment, H1 is at least 1.3 times the length of H2. It should be appreciated that cantilever pin 530 may have a greater height, H1, compared to the height of cantilever pin 540, H2, so that cantilever pin 530 may contact the DUT before cantilever pin 540. Accordingly, cantilever pin 530 may provide a proper discharge path for any built-up charges between the DUT and test contactor 500 to prevent or reduce the chances of ESD damaging the DUT.

Figure 6:
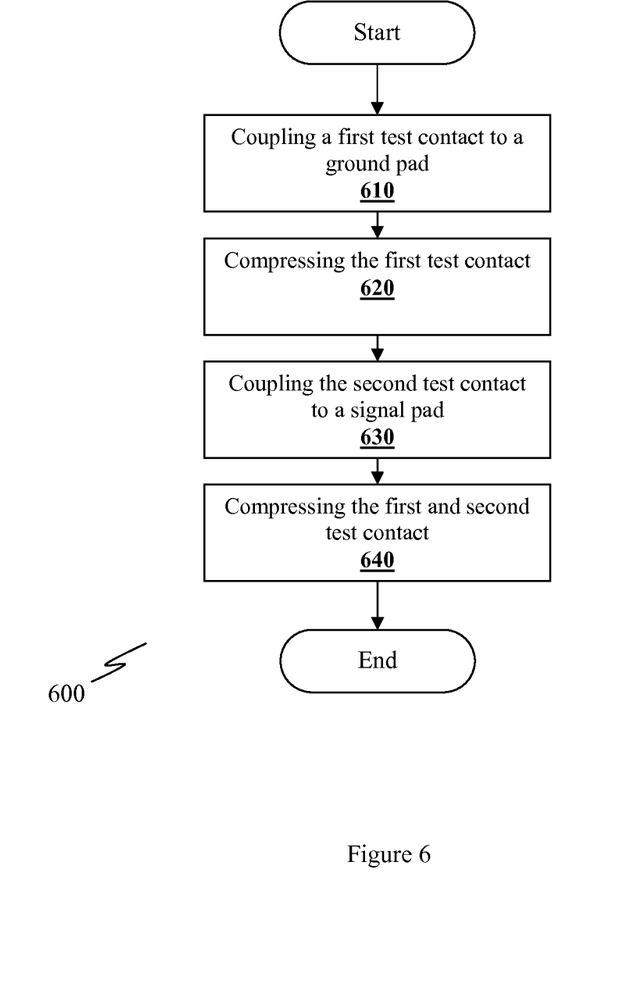
FIG. 6, meant to be illustrative and not limiting, illustrates a method of testing a DUT in accordance with one embodiment.

FIG. 6, meant to be illustrative and not limiting, illustrates a method of testing a DUT in accordance with one embodiment. It should be appreciated that method 600 may represent a flow to test a DUT with a test contactor (e.g., DUT 230 and test contactor 100 of FIGS. 2A and 2B). At step 610, a first test contact, which is coupled to ground, is coupled to a ground pad of a DUT. In one embodiment, the first test contact and the ground pad may be similar to, respectively, test contact 150 and ground pad 210 of FIG. 2A.

At step 620, the first test contact is compressed. According to one embodiment, the first test contact may be compressed when the DUT is pushed towards the test contactor. In an exemplary embodiment, the first test contact may be relatively longer than a second test contact and the first test contact may be compressed until its length becomes substantially the same as that of the second test contact. In one embodiment, the first test contact may be approximately 1.3 times longer than the second test contact and as such, the first test contact may be compressed by at least 0.3 times the length of the second test contact. Subsequent to step 620, the second test contact is coupled to a signal pad on the DUT at step 630. In the embodiment of FIG. 2B, test contact 160 is coupled to signal pad 220 of DUT 230. It should be appreciated that signals may be transferred between the test contactor and the DUT after the first and second test contacts on the test contactor are coupled to the ground and signal pads, respectively.

At step 640, both the first test contact and the second test contact are further compressed by an additional predefined distance. It should be appreciated that at the completion of step 630, the first test contact and the second test contact may not observe identical forces within the first test contact and the second test contact, which is undesirable. The additional predefined distance may enable the first test contact and the second test contact to reach an identical (or substantially equivalent) force within them. Subsequently, signal transmission in and out of the DUT may commence.

The embodiments, thus far, were described with respect to integrated circuits. The method and apparatus described herein may be incorporated into any suitable circuit. For example, the method and apparatus may be incorporated into numerous types of devices such as microprocessor, programmable logic devices (PLDs), application specific standard products (ASSPs) and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs) and field programmable gate arrays (FPGAs).

The programmable logic device described herein may be part of a data processing system that includes one or more of the following components; a processor; memory; I/O circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by the assignee.

Although the method of operations were described in a specific order, it should be understood that other operation may be performed in between described operations, described operations may be adjusted so that they occur at slightly different times or described operations may be distributed in a system which allows occurrence of the processing operation at various intervals associated with the processing, as long as the processing of the overlay operations are performed in a desired way.

Although the foregoing invention has been described in some detail for the purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A test contactor comprising:
a Printed Circuit Board (PCB) configured to transfer electrical signals through a plurality of signal pathways, wherein the plurality of signal pathways couples a signal source to a signal destination;
a first test contact coupled to a first signal pathway of the plurality of signal pathways, wherein the first test contact is configured to transfer the electrical signals; and
a second test contact coupled to a second signal pathway of the plurality of signal pathways, wherein the second test contact is configured to provide a ground voltage, and
wherein the first test contact and the second test contact are pogo pins or spring probes, and a length of the second test contact is greater than a length of the first test contact and a spring constant of the first test contact is greater than a spring constant of the second test contact, and wherein the spring constant of the first test contact and the spring contact of the second test contact are tuned so that, with the Printed Circuit Board pressed to a Device Under Test (DUT), the first test contact is compressed to a same compressed length as the second test contact and the first test contact presses on the Device Under Test with a same force as the second test contact.

2. The test contactor in claim 1, wherein the second test contact is coupled to the Device Under Test prior to the first test contact in order to equalize electrostatic charges on the Device Under Test before the first test contact is coupled to the Device Under Test.

3. The test contactor in claim 1, wherein the first test contact and the second test contact have an equivalent applied compression force upon reaching an identical length from a surface of the PCB.

4. The test contactor in claim 1, wherein the first test contact and the second test contact are partially embedded within the PCB.

5. The test contactor in claim 1, wherein the electrical signals are Input/Output (I/O) signals.

6. The test contactor in claim 1, wherein the first test contact and the second test contact are pogo pins or spring probes, having differing spring constants.

7. The test contactor in claim 1, wherein the first test contact and the second test contact are disposed at edges of the respective first and second signal pathways.

8. The test contactor in claim 1, wherein the second test contact provides a propagation pathway for electrostatic charge.

9. The test contactor in claim 1, wherein the first test contact and the second test contact are compressible perpendicular to a surface of the PCB.

10. The test contactor in claim 1, further comprising:
a plurality of the first test contacts; and
a plurality of the second test contacts,
wherein the plurality of the first test contacts and the plurality of the second test contacts are distributed symmetrically on a PCB surface so as to prevent the test contactor from tilting when the plurality of the second test contacts come into contact with the Device Under Test before the plurality of the first test contacts.

11. A test apparatus comprising:
a tester, comprising:
an electrical signal source configured to generate an electrical signal; and
a ground source configured to provide a ground voltage level; and
a test contactor that is coupled to the tester, said test contactor comprising:
a Printed Circuit Board (PCB) with a first signal pathway and a second signal pathway, wherein the first signal pathway is coupled to the electrical signal source and the second signal pathway is coupled to the ground source;
a first test contact coupled to the first signal pathway; and
a second test contact coupled to the second signal pathway,
wherein a length of the second test contact is greater than a length of the first test contact and a spring constant of the first test contact is greater than a spring constant of the second test contact, with the spring constants tuned so that pressing the Printed Circuit Board to a Device Under Test (DUT) compresses the first test contact and the second test contact to a same compressed length with the first test contact and the second test contact pressing with a same force.

12. The testing apparatus in claim 11, wherein the electrical signal source generates an Input/Output (I/O) signal.

13. The testing apparatus in claim 12, wherein the ground source is configured to discharge an electrostatic potential when the second test contact is coupled with the Device Under Test.

14. The testing apparatus in claim 12, wherein the second signal pathway is configured to provide a propagation discharge pathway for an electrostatic voltage surge.

15. The testing apparatus in claim 12, wherein one of the first test contact or the second test contact is one of pogo pins, cantilever pins or spring probes.

16. The testing apparatus in claim 12, wherein the test contactor is coupled to an interface surface of the tester.

17. A method to test a Device Under Test (DUT), said method comprising:
coupling an uncompressed first test contact to a first contact pad of the DUT;
compressing the first test contact by a first predetermined length;
subsequent to said compressing, coupling an uncompressed second test contact to a second contact pad of the DUT; and
compressing the first test contact and the second test contact by a second predetermined length, so that the first test contact, compressed by the first predetermined length and the second predetermined length, and the second test contact, compressed by the second predetermined length, have a same compressed length and are pressing on the DUT with a same force,
wherein a length of the uncompressed first test contact is greater than a length of the uncompressed second test contact and a spring constant of the first test contact is lower than a spring constant of the second test contact.

18. The method in claim 17, wherein the first predetermined length is equivalent to a difference of length between the uncompressed first test contact and the uncompressed second test contact.

19. The method in claim 17, further comprising:
transferring an input/output (I/O) signal through the second test contact.

20. The method in claim 17, wherein first test contact pad is a ground contact pad and the second contact pad is a signal contact pad.

21. The method in claim 17, further comprising:
discharging an electrostatic potential of the first contact pad once the first test contact couples with the first contact pad.

\* \* \* \* \*